(12) United States Patent
Ederyd et al.

(10) Patent No.: US 9,656,345 B2
(45) Date of Patent: May 23, 2017

(54) FRICTION STIR WELDING TOOL MADE OF CEMENTED TUNGSTEN CARBIDE WITH NICKEL AND WITH A AL2O3 SURFACE COATING

(71) Applicant: SANDVIK INTELLECTUAL PROPERTY AB, Sandviken (SE)

(72) Inventors: Stefan Ederyd, Saltsjo-Boo (SE); Henrik Nordenstrom, Arsta (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 0 days.

(21) Appl. No.: 14/357,257

(22) PCT Filed: Nov. 9, 2012

(86) PCT No.: PCT/EP2012/004661
§ 371 (c)(1),
(2) Date: May 9, 2014

(87) PCT Pub. No.: WO2013/068122
PCT Pub. Date: May 16, 2013

(65) Prior Publication Data
US 2014/0312099 A1 Oct. 23, 2014

(30) Foreign Application Priority Data

Nov. 11, 2011 (EP) .................................... 11188809

(51) Int. Cl.
*B23K 20/12* (2006.01)
*C22C 29/08* (2006.01)
*C23C 16/40* (2006.01)
*B23K 101/18* (2006.01)
*B23K 103/04* (2006.01)

(52) U.S. Cl.
CPC ...... *B23K 20/1245* (2013.01); *B23K 20/1255* (2013.01); *C22C 29/08* (2013.01); *C23C 16/403* (2013.01); *B23K 2201/18* (2013.01); *B23K 2203/04* (2013.01)

(58) Field of Classification Search
USPC .............................................. 228/2.1, 112.1
See application file for complete search history.

(56) References Cited

U.S. PATENT DOCUMENTS

| | | | |
|---|---|---|---|
| 6,022,175 A * | 2/2000 | Heinrich et al. | 407/119 |
| 8,701,964 B2 * | 4/2014 | Moriguchi et al. | 228/2.1 |
| 8,936,186 B2 * | 1/2015 | Aoyama et al. | 228/2.1 |
| 8,998,062 B2 * | 4/2015 | Moriguchi et al. | 228/2.1 |
| 2006/0065694 A1 * | 3/2006 | Stol | B23K 20/1255 228/2.1 |
| 2006/0169747 A1 | 8/2006 | Tolle et al. | |

(Continued)

FOREIGN PATENT DOCUMENTS

| | | |
|---|---|---|
| EP | 2514552 A1 | 10/2012 |
| JP | 61110771 A | 5/1986 |

(Continued)

*Primary Examiner* — Devang R Patel
(74) *Attorney, Agent, or Firm* — Corinne R. Gorski

(57) ABSTRACT

A friction stir welding tool for welding of metallic plates and especially steel plates. The friction stir welding tool is made of cemented carbide comprising WC grains in a binder phase and wherein the welding tool is at least partly coated with a surface coating comprising $Al_2O_3$.

12 Claims, 1 Drawing Sheet

(56) References Cited

U.S. PATENT DOCUMENTS

| | | | |
|---|---|---|---|
| 2008/0023524 A1* | 1/2008 | Ohashi | B23K 20/1245 228/2.1 |
| 2010/0258612 A1 | 10/2010 | Kolbeck et al. | |
| 2012/0248175 A1 | 10/2012 | Moriguchi et al. | |
| 2013/0199411 A1* | 8/2013 | Carpenter et al. | 106/286.3 |

FOREIGN PATENT DOCUMENTS

| | | | |
|---|---|---|---|
| JP | H6262407 A | | 9/1994 |
| JP | H7252579 A | | 10/1995 |
| JP | 2007268605 A | | 10/2007 |
| JP | 200830096 A | | 7/2008 |
| JP | 2009214170 A | | 9/2009 |
| JP | 2010260065 A | * | 11/2010 |
| JP | 2011504808 A | | 2/2011 |
| WO | 9519457 A1 | | 7/1995 |
| WO | 2011074530 A | | 6/2011 |

\* cited by examiner

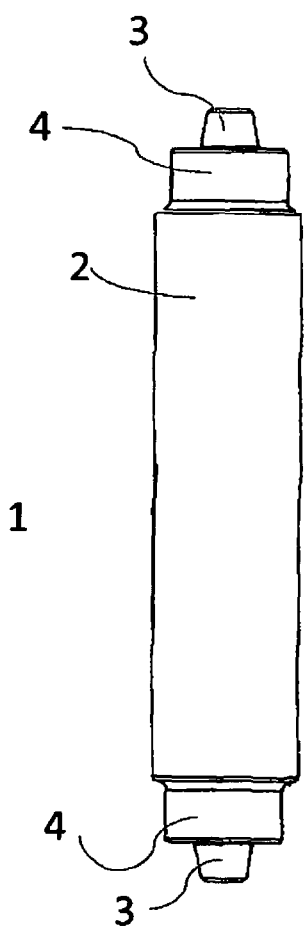

FRICTION STIR WELDING TOOL MADE OF CEMENTED TUNGSTEN CARBIDE WITH NICKEL AND WITH A AL2O3 SURFACE COATING

RELATED APPLICATION DATA

This application is a §371 National Stage Application of PCT International Application No. PCT/EP2012/003661 filed Nov. 9, 2012 claiming priority of EP Application No. 11188809.5, filed Nov. 11, 2011.

TECHNICAL FIELD OF THE INVENTION

The present invention relates to a friction stir welding tool for welding of metallic plates and especially steel plates.

BACKGROUND

Friction stir welding has been used in industry for many years, and especially in welding of metallic materials such as aluminum, brass and bronze. It is a solid state process that involves local plastic deformation via friction heat provided by a rotating and moving friction stir welding probe forced to move along the joint to be welded. The friction heat from the contact between the probe and the metallic material in the joint makes the metallic material stirable, and the rotation and movement of the probe along the joint results in a weld of stirred material.

Friction stir welding is a technique that has a potential to yield large economical benefits compared to traditional laser welding or fusion welding which involves rapid solidification of molten material. Advantages with friction stir welding are the limited area that is heated and also that the resulting weld is often sufficiently smooth to eliminate a subsequent polishing step.

Friction stir welding of steel can provide a weld with less pores, less carbon diffusion and a higher strength compared to a traditional arc welding or laser beam welding.

The condition for the friction stir welding probe during a welding process of steel is highly demanding. Friction stir welding involves thermal cycling at high temperatures. The temperature in the weld is probably about 800-1000° C., and the mechanical strength of the probe must be high at this high temperature. If the mechanical strength at high temperature is insufficient, the probe will suffer from oxidation, wear and collapse or break.

US2010/0258612A1 discloses a friction stir welding tool for welding steel made of hard metal partly coated with one or more layers.

There is a need for further improvements in the field of friction stir welding tools. A friction stir welding tool should not be too expensive, have a long and predictable lifetime and comprise high strength and wear resistance at high temperatures.

SUMMARY OF THE INVENTION

It is an object of the present invention to provide a friction stir welding tool with improved characteristics compared to known friction stir welding tools.

It is a further object of the present invention to provide a friction stir welding tool with high wear resistance and high oxidation resistance.

The present invention discloses a friction stir welding tool, a method of producing such tool and usage of such tool according to the appended independent claims. Further embodiments are disclosed in the dependent claims.

The friction stir welding tool according to the invention is made of cemented carbide with WC grains in a binder phase wherein said cemented carbide comprises from 3 wt % to 10 wt % Ni and wherein the welding tool is at least partly coated with a surface coating comprising $Al_2O_3$.

In one embodiment, the friction stir welding tool is made of cemented carbide with WC grains in a binder phase wherein said cemented carbide comprises from 3 to 10 wt-% Ni and wherein the welding tool is at least partly coated with a surface coating comprising at least a first surface coating made of at least one of a Ti compound and a Zr compound, which is an inner layer, comprising at least one layer of a Ti carbide layer, Ti nitride layer, Ti carbonitride layer, Ti oxicarbide layer, Ti oxicarbonitride layer, Zr carbide layer, Zr nitride layer, Zr carbonitride layer, Zr oxicarbide layer and Zr oxicarbonitride layer and a second surface coating, which is an outer layer, comprising $Al_2O_3$.

The friction stir welding tool according to the invention has a high hot hardness, high mechanical strength and is resistant to thermo-mechanical fatigue.

The welding can be performed in a material that is plastically deformable, for example aluminium, copper, brass, bronze, steels and other metallic materials and alloys. In particular the friction stir welding tool of the invention enables welding of steel to steel and steel to aluminium, whereby the tool is subjected to very high temperatures.

The friction stir welding tool according to the present invention can be of any desirable shape. The probe can for example be truncated, screw shaped with flutes or comprise any other, for the application, suitable design.

Cemented carbide is a material that typically includes WC grains in a binder phase. Cemented carbide can be produced in a process comprising milling, spray drying, pressing and sintering. The WC grains in the cemented carbide are sometimes called the alpha-phase. The size of the WC grains is typically changing during the sintering process. The grain size referred to in this document is the grain size of the WC grains after sintering. The WC grain size is measured with Jeffries' planimetric method (ASTM E112), which is a method based on counting of the number of grains within a known area.

The binder phase in the typical cemented carbide is the metallic phase surrounding WC grains and other hard phases that can be present, for example hard phases like TiN, TiC or TiCN. A Ni-content in the binder phase is advantageous as it contributes to a high resistance to thermo-mechanical fatigue of the cemented carbide. The Ni-content also gives an enhanced oxidation resistance of the cemented carbide. The cemented carbide in the friction stir welding tool of the present invention comprises from 3 to 10 wt-% Ni, preferably from 4 to 5 wt-% Ni.

A surface coating may contribute to an enhanced oxidation resistance of the cemented carbide. The second surface coating of the present invention preferably comprises of $Al_2O_3$, more preferably of alpha-$Al_2O_3$, most preferably of fine-grained alpha-$Al_2O_3$.

The surface coating of the present invention can be applied to cover the whole outer surface of the tool or only on a portion of the outer surface of the tool, preferably on the portions exposed to wear during a welding process. The surface coating can for example be applied with a chemical vapour deposition (CVD) or a physical vapour deposition (PVD) technique.

In one embodiment of the present invention the outer surface of the welding tool is completely coated with said surface coating. A completely coated tool is advantageous since a totally coated friction stir welding tool shows a high oxidation resistance.

In one embodiment of the present invention the surface coating is applied with a CVD technique. This is advantageous since the whole outer surface of the tool can be coated simultaneously, and that a relatively thick coating can be applied without any problems related to high compressive stresses.

In one embodiment of the present invention said surface coating comprises an outermost second surface coating of $Al_2O_3$ and the first surface coating, which is an intermediate surface coating, i.e. an inner layer, is applied such that the cemented carbide is not in direct contact with said second surface coating of $Al_2O_3$. The thickness of the intermediate surface coating is preferably more than 0.3 µm and less than 6 µm.

In one embodiment, the intermediate coating is aimed to promote an alpha-$Al_2O_3$ to grow during the CVD process of $Al_2O_3$, and prevent a kappa-$Al_2O_3$ to grow during said CVD process. The intermediate coating can for example be TiN, TiCN, ZrC, TiC or mixtures thereof.

In one embodiment of the present invention the second surface coating comprising $Al_2O_3$ has an average thickness of more than 5 µm, preferably at least 6 µm. The average thickness is preferably less than 30 µm and more preferably less than 20 µm. This thickness is advantageous since it increases the wear resistance and provides sufficient heat insulation.

In one embodiment of the present invention said cemented carbide comprises from 3 to 10 wt-% Co, preferably from 4 to 5 wt-% Co. This Co-content increases the toughness and the mechanical strength of the cemented carbide. This is advantageous since it improves the thermomechanical fatigue resistance and the heat conductivity.

In one embodiment of the present invention the binder phase comprises Co and Ni with a ratio Co/Ni of 0.3-3, preferably 0.75-1.25, most preferably about 1 and with a preferred total content of Co and Ni of about 10 wt-%, more preferably from 8 to 10 wt-%, most preferably from 9 to 10 wt-%, in the cemented carbide.

In one embodiment of the present invention said binder phase comprises 0.8-1.2 wt-% Cr and/or Mo. The Cr and/or Mo content enhance the oxidation resistance of the binderphase. At lower Cr content the oxidation resistance is reduced and at higher Cr content Cr carbides are formed, which may lead to embrittlement. Furthermore, the Curie point of a cemented carbide material with Cr is lower than of a pure WC—Co cemented carbide. Addition of Cr is also beneficial due to a decreased risk of phase transformations and volume changes of the binder phase.

In one embodiment of the present invention said binder phase comprises 0.01-0.4 wt-% Fe. The Fe-content enhance the oxidation resistance of the binder-phase.

In one embodiment of the present invention the friction stir welding tool comprises 85-95 wt-% WC grains. This enhanced content of WC is advantageous as the heat conductivity of the material is increased and the tendency to form thermal cracks is reduced. Further, the resistance to thermal shock of the cemented carbide is increased as well as the mechanical strength. The heat conductivity increases with lower binder phase content.

In one embodiment of the present invention, the average WC grain size in the cemented carbide is 2-25 µm, preferably more than 3 µm, more preferably 5 to 8.5 µm. The heat conductivity increases with increased grain size. The grain size of the WC-grains in the microstructure (alpha-phase) is measured with Jeffries' planimetric method (ASTM E112). An advantage with such coarse WC grains is that such cemented carbide has high mechanical strength and high wear resistance. The coarse grains also give a rough surface of the cemented carbide after the sintering, which can be advantageous in a friction stir welding process.

In one embodiment said cemented carbide comprises, in addition to WC, up to 5 wt-% of cubic carbides.

In one embodiment of the present invention said tool comprises two probes wherein each probe is intended for contact with the material to be welded during a friction stir welding process, wherein said probes are arranged opposite to each other, such that when the first probe is active in a friction stir welding process, the second probe is inactive.

In one embodiment of the present a friction stir welding process with a friction stir welding tool according to the invention is performed in a welding atmosphere comprising $N_2$ or Ar. This is advantageous to prevent decarburization and oxidation of the working material. The $Al_2O_3$-coated tool do not nitrify in an $N_2$ environment and $N_2$ is therefore a possible protective gas in addition to the conventionally used Ar.

BRIEF DESCRIPTION OF DRAWINGS

Embodiments of the present invention will now be disclosed in more detail with reference to the drawing.

FIGURE shows an example of a friction stir welding tool, with two opposite probes on the same tool, according to one embodiment of the present invention.

DETAILED DESCRIPTION OF PREFERRED EMBODIMENTS

Reference will now be made to the drawing in which various elements of the present invention will be given numerical designations. It is to be understood that the following description is only exemplary and that the scope of the invention is set by the appended claims.

FIGURE shows a friction stir welding tool 1 according to an embodiment of the present invention. The tool 1 comprises a body 2 and at each end of the tool there is a shoulder 4 and a probe 3. The friction stir welding tool 1 is made of cemented carbide and the tool 1 is completely coated, i.e. all outer surfaces of the tool 1, i.e. the body 2, the shoulders 4 and the probes 3, are coated with a surface coating.

On the friction stir welding tool 1 two probes 3 are arranged opposite to each other, such that when the first probe 3 is active in a friction stir welding process, the second opposite probe 3 is inactive. During a friction stir welding process, one of the probes 3 is located in between the two plates to be welded, and its shoulder 4 is located just above the joint. It is only one probe 3 at a time that is active during the friction stir welding process. The other probe 3 can for example be used when the first one has been worn out.

The following examples are aimed to illustrate the invention.

EXAMPLE 1

Test of Chemical Resistance

Samples A, B, C and D were evaluated with regards to their chemical resistance in a casting test where the samples were partly casted into low carbon steel.

Each of sample A, B, C and D are made of cemented carbide comprising 90 wt-% WC with a grain size of 5 µm (measured according to Jeffries' planimetric method, ASTM E112), 4.7 wt-% Co, 4.3 wt-% Ni and 1 wt-% Cr. Samples A, B and C were CVD coated prior to the casting test. Sample A was coated with a 3.3 µm thick intermediate coating of TiN and an outer 10 µm thick $Al_2O_3$ surface coating, sample B was coated with a 4 µm thick TiCN surface coating and sample C with a 4 µm thick TiN surface coating. The coated samples A, B and C and the uncoated sample D were casted into a low carbon steel.

The melting point of the steel is 1565° C. Each sample was partly soaked into the melted steel for ten minutes, after which the steel self-cooled down to room temperature in air. After the casting test, a through cut was made in each partly casted sample and the through cuts were studied in a scanning electron microscope (SEM). Samples B, C and D dissolved in this casting test, while sample A1 showed no sign of dissolution and thereby a good chemical resistance. A summary of the result is shown in Table 1.

TABLE 1

| Sample | Coating | Coating thickness | Chemical resistance |
|---|---|---|---|
| A | TiN + $Al_2O_3$ (invention) | 3.3 µm + 10 µm | Good |
| B | TiCN (comparative) | 4 µm | Poor* |
| C | TiN (comparative) | 4 µm | Poor* |
| D | No coating (comparative) | — | Poor* |

*Excessive dissolution of the cemented carbide.

EXAMPLE 2

Oxidation Test

Samples E, F and G were prepared and evaluated with regards to their oxidation resistance in an oxidation test where the samples were heat treated in a furnace in air.

Each of sample E, F and G are made of cemented carbide comprising 90 wt-% WC with a grain size of 5 µm (measured according to Jeffries' planimetric method. ASTM E112), 4.7 wt-% Co, 4.3 wt-% Ni and 1 wt-% Cr. Samples E, F and G were CVD coated prior to the oxidation test. Sample E was coated with a 2 µm thick intermediate coating of TiN and an outer 6 µm thick $Al_2O_3$ surface coating, sample E was coated with a 4 µm thick TiAlN surface coating and sample G with a 4 µm thick TiN surface coating. The coated samples E, F and G were tested in an oxidation test.

This oxidation test comprises treating said samples in a furnace at 950° C. for 12 hours in air. The samples were cooled to room temperature in air and evaluated based on their appearance after the test. If the sample did not show any sign of oxidation, the oxidation resistance was regarded good. If the sample was oxidized or cracked at the surface or cracked through the whole sample, the oxidation resistance was regarded poor.

The result is summarised in Table 2.

TABLE 2

| Sample | Coating | Coating thickness | Oxidation resistance |
|---|---|---|---|
| E | TiN + $Al_2O_3$ (invention) | 2 µm TiN + 6 µm $Al_2O_3$ | Good |
| F | TiAlN (comparative) | 4 µm | Poor* |
| G | TiN (comparative) | 4 µm | Poor* |

*Excessive oxidation of the cemented carbide.

EXAMPLE 3

Friction Stir Welding Test

Friction stir welding tests were performed with three different probes, probes H, I and J. All probes were made of cemented carbide and had a cylindrical shoulder with a tapered pin, a pin diameter of around 5 mm and a shoulder diameter of 16 mm. The welding tests were performed in a joint between two 4 mm thick plates of Al, Cu or low carbon steel (C: 0.2%, Si: 0.3%, P: 0.04%, S: 0.05%, Fe: Balance, with a hardness 30 HRC). The tests were performed with a welding speed of 150 mm/minute, a maximum down force of 230 kN, a rotation speed of 300 rpm and a tilt angle of 1.5°.

Probe H is uncoated and made of cemented carbide of the so called grade C10C. Grade C10C is a cemented carbide comprising 4.7 wt-% Co, 4.3 wt-% Ni and 1 wt-% Cr, 90 wt-% WC, where the average WC grain size is 5 µm. Probe H was tested in friction stir welding in Al, Cu and low carbon steel (with the composition presented above). The friction stir welding test of probe H was run for 12 meters. The result of the friction stir welding test in Al and Cu, respectively, was that the probes did not show any damage after the completed test. The result of the friction stir welding test in said low carbon steel was that the top portion of the probe was gone after the completed test.

Probe I is uncoated and made of cemented carbide of the so called grade S6. Grade S6 is a cemented carbide with comprising 12 wt-% (Ta, Nb, Ti)C, 11 wt-% Co and 77 wt% WC, where the average WC grain size is 2 µm. Probe I was tested in friction stir welding in Al, Cu and low carbon steel (with the composition presented above). The friction stir welding test of probe H was run for 4 meters. The result of the friction stir welding test in said low carbon steel was that the top portion of the probe was gone after the test and cracks was observed in the tool.

Probe J is made of cemented carbide of the so called grade C10C completely coated with a surface coating comprising an intermediate coating of TiN and an outer coating of $Al_2O_3$. The TiN coating is 0.3 µm thick and the $Al_2O_3$ coating is 15 µm thick. Grade C10C is a cemented carbide comprising 4.7 wt-% Co, 4.3 wt-% Ni and 1 wt-% Cr, 90 wt-% WC, where the average WC grain size is 5 µm. Probe J was tested in friction stir welding in low carbon steel (with the composition presented above). The friction stir welding test of probe J was run for 40 meters. The result of the friction stir welding test in said low carbon steel was that the tool did not show any damages of the coating and no cracks could be observed.

The result of the friction stir welding test is summarized in Table 3 and shows that probe J, made of cemented carbide of the so called C10C grade coated with an outer layer of $Al_2O_3$, is high performing. This implies that probe J has sufficiently high oxidation resistance, high chemical resistance, high strength and hot hardness during the friction stir welding test in steel. The absence of cracks in the probe after the test also shows a high resistance against thermo-mechanical fatigue.

TABLE 3

| Probe | Probe material | Welded material | Welding distance | Welding performance |
|---|---|---|---|---|
| H | Not coated cemented | Cu | 12 meter | No damage of probe |

TABLE 3-continued

| Probe | Probe material | Welded material | Welding distance | Welding performance |
|---|---|---|---|---|
|  | carbide of grade C10C | Al | 12 meter | No damage of probe |
|  |  | Low carbon steel | 12 meter | Top portion of probe gone |
| I | Not coated cemented carbide of grade S6 | Low carbon steel | 4 meter | Top portion of probe gone |
| J | Al$_2$O$_3$-coated cemented carbide of grade C10C (invention) | Low carbon steel | 40 meter | No damage of probe |

Although described with reference to a preferred embodiment of the present invention, it should be readily apparent to one ordinary skilled in the art that various changes and/or modifications can be made without departing from the scope of the invention as set forth in the accompanying claims. In general, the invention is only intended to be limited by the following claims.

The invention claimed is:

1. A friction stir welding tool made of cemented carbide comprising WC grains in a binder phase, wherein said welding tool is completely coated with a surface coating consisting of a first surface coating and a second surface coating, the first surface coating being an inner layer selected from the group consisting of a Ti carbide layer, Ti nitride layer, Ti carbonitride layer, Ti oxicarbide layer, Ti oxicarbonitride layer, Zr carbide layer, Zr nitride layer, Zr carbonitride layer, Zr oxicarbide layer and Zr oxicarbonitride layer, and the second surface coating being an outer layer of Al$_2$O$_3$ that has an average thickness of more than 5 μm, said cemented carbide including from 3 wt-% to 10 wt-% Ni, wherein said surface coating is a CVD coating.

2. The friction stir welding tool according to claim 1, wherein said second surface coating is an outermost surface coating of Al$_2$O$_3$ and said first surface coating is of TiN.

3. The friction stir welding tool according claim 1, wherein the thickness of the first surface coating is more than 0.3 μm and less than 6 μm.

4. The friction stir welding tool according to claim 1, wherein said cemented carbide comprises from 4 to 5 wt-% Ni.

5. The friction stir welding tool according claim 1, wherein said cemented carbide comprises from 3 to 10 wt-% Co.

6. The friction stir welding tool according to claim 1, wherein said cemented carbide comprises from 4 to 5 wt-% Co.

7. The friction stir welding tool according to claim 1, wherein said cemented carbide comprises 0.8-1.2 wt-% of Cr and/or Mo.

8. The friction stir welding tool according to claim 1, wherein said cemented carbide comprises 0.01 to 0.4 wt-% Fe.

9. The friction stir welding tool according to claim 1, wherein said cemented carbide comprises 85-95 wt-% WC with an average WC grain size of 2-25 μm.

10. The friction stir welding tool according to claim 1, wherein said tool includes two probes, each probe contacting a material to be welded during a friction stir welding process, wherein said probes are arranged opposite to each other, such that when the first probe is active in a friction stir welding process, the second probe is inactive.

11. A method of producing a friction stir welding tool made of cemented carbide comprising WC grains in a binder phase by completely CVD coating the welding tool with a surface coating consisting of a first surface coating and a second surface coating, the first surface coating being an inner layer selected from the group consisting of a Ti carbide layer, Ti nitride layer, Ti carbonitride layer, Ti oxicarbide layer, Ti oxicarbonitride layer, Zr carbide layer, Zr nitride layer, Zr carbonitride layer, Zr oxicarbide layer and Zr oxicarbonitride layer, and the second surface coating being an outer layer of Al$_2$O$_3$ that has an average thickness of more than 5 μm, the cemented carbide including from 3 wt-% to 10 wt-% Ni, wherein said surface coating is a CVD coating.

12. A method of using a friction stir welding tool in a friction stir welding process, comprising the steps of:
providing a friction stir welding tool made of cemented carbide comprising WC grains in a binder phase, the tool being completely coated with a surface coating consisting of a first surface coating and a second surface coating, the first surface coating being an inner layer selected from the group consisting of a Ti carbide layer, Ti nitride layer, Ti carbonitride layer, Ti oxicarbide layer, Ti oxicarbonitride layer, Zr carbide layer, Zr nitride layer, Zr carbonitride layer, Zr oxicarbide layer and Zr oxicarbonitride layer, and the second surface coating being an outer layer of Al$_2$O$_3$ that has an average thickness of more than 5 μm, the cemented carbide including from 3 wt-% to 10 wt-% Ni, wherein said surface coating is a CVD coating; and
using the friction stir welding tool in the friction stir welding process, wherein said process is performed in a welding atmosphere of N$_2$ or Ar.

* * * * *